(12) United States Patent
Liang

(10) Patent No.: US 6,644,396 B2
(45) Date of Patent: Nov. 11, 2003

(54) ANCHOR BASE FOR HEAT SINK OF IC CHIPSET

(75) Inventor: Robert Liang, Taoyuan (TW)

(73) Assignee: Malico Inc. (TW)

( * ) Notice: Subject to any disclaimer, the term of this patent is extended or adjusted under 35 U.S.C. 154(b) by 0 days.

(21) Appl. No.: 09/902,388

(22) Filed: Jul. 10, 2001

(65) Prior Publication Data

US 2003/0011995 A1 Jan. 16, 2003

(51) Int. Cl.[7] .................................................. H05K 7/20
(52) U.S. Cl. ...................... 165/185; 174/16.3; 257/719; 361/704; 24/531; 165/80.3
(58) Field of Search ............................... 165/80.3, 185; 174/16.3; 257/718, 719; 361/704; 24/531

(56) References Cited

U.S. PATENT DOCUMENTS

| | | | |
|---|---|---|---|
| 5,208,731 A | * 5/1993 | Blomquist | 361/704 |
| 5,241,453 A | * 8/1993 | Bright et al. | 361/704 |
| 5,276,585 A | 1/1994 | Smithers | 361/704 |
| 5,381,305 A | * 1/1995 | Harmon et al. | 361/704 |
| 5,495,392 A | * 2/1996 | Shen | 257/718 |
| 5,831,829 A | 11/1998 | Lin | 361/704 |
| 6,153,932 A | 11/2000 | Liang | 257/712 |

\* cited by examiner

*Primary Examiner*—Leonard Leo
(74) *Attorney, Agent, or Firm*—Ostrolenk, Faber, Gerb & Soffen, LLP

(57) ABSTRACT

An anchor base for a heat sink for an IC chipset is formed basically in a rectangular frame comprising: two lateral plates respectively formed at the bottom of two opposite lateral stiles of the rectangular frame, each of the two opposite lateral plates having a respective snap barb at its lower portion; a longitudinal resilient rod bridging the other two opposite lateral stiles of the rectangular frame, wherein two ends of the longitudinal resilient rod are extended downwardly to form a pair of protruding rods which are no shorter than the height of the lateral plates; a shorter resilient rod crossing the longitudinal resilient rod; wherein a protrusion is formed at the bottom of each of two ends of the shorter resilient rod. Thus, an anchor base for a heat sink can be made without any extra perforation or cutting steps. The shorter resilient rod uses the deformation torque of the longitudinal resilient rod so as to enhance the pressure of the shorter resilient rod on the heat sink for a close attachment of the heat sink to the chipset.

3 Claims, 4 Drawing Sheets

ANCHOR BASE FOR HEAT SINK OF IC CHIPSET

FIELD OF THE INVENTION

This invention relates generally to an anchor base for a heat sink for an IC chipset, particularly to an anchor base made to fit in precisely with a heat sink and a chipset in order to heighten the heat-dissipation efficiency of the heat sink.

BACKGROUND OF THE INVENTION

An anchor base is usually implemented in order to facilitate close attachment of a heat sink onto an IC chipset so as to efficiently disperse the heat created and keep the chipset cool under normal conditions, particularly during high-speed operation.

Patent application No. 88211752 of the R.O.C. (Taiwan), which corresponds to U.S. Pat. No. 6,153,932, discloses an anchor base in the form of a rectangular frame which is extended downwardly from its two opposite lateral sides to form respective lateral plates 11, wherein a protruding snap barb 111 is arranged on the inner face of each lateral plate at its lower portion; the other two opposite sides of the anchor base are extended downwardly to form respective protruding rods 12 which are equal to or longer than the height of the lateral plates 11; and a plurality of resilient rods 13 are formed on the inner wall of the rectangular frame, and a projecting portion 131 is arranged at a lower part of each of the resilient rods.

Whereas a heat sink must be perforated, punched or cut to form holes or slots, respectively, before being locked to the anchor base, the heat-dissipation efficiency is usually lowered because of lessening of the heat sink surface. As a remedy, the pressure of a projecting portion of the resilient rods applied onto the heat sink must be enhanced.

SUMMARY OF THE INVENTION

The primary object of this invention is to provide an anchor base for a heat sink for an IC chipset, characterized in: at least one longitudinal resilient rod longer than a heat sink being provided to the anchor base to thereby eliminate extra processing steps for forming holes or slots in the heat sink; and further characterized by a relatively shorter resilient rod for enlarging deformation torque of the longitudinal resilient rod so that two protrusions of the short resilient rod can press the heat sink more closely to heighten heat-dissipation efficiency and shorten the conventional installation procedure.

In order to realize the abovesaid object, the anchor base for a heat sink of an IC chipset is formed basically in a rectangular frame comprising: two lateral plates respectively formed at the bottom of two opposite lateral stiles of the rectangular frame, each of the two opposite lateral plates having respective snap barb at its lower portion; a longitudinal resilient rod bridging the other two opposite lateral stiles of the rectangular frame, wherein two ends of the longitudinal resilient rod are extended downwardly to form a pair of protruding rods which are no shorter than the height of the lateral plates; a relatively shorter resilient rod crossing the longitudinal resilient rod, wherein a protrusion is formed on each of two ends of the shorter resilient rod at a lower position. Hence, the anchor base for the heat sink can be made without any extra perforation or forming process steps. The shorter resilient rod uses the deformation torque of the longitudinal resilient rod so as to enhance pressure of the shorter resilient rod onto the heat sink for a close attachment of the heat sink to the chipset.

For more detailed information regarding advantages or features of this invention, at least an example of a preferred embodiment will be elucidated below with reference to the annexed drawings.

BRIEF DESCRIPTION OF THE DRAWINGS

The related drawings in connection with the detailed description of this invention, which is to be made later, are described briefly as follows, in which.

DETAILED DESCRIPTION OF THE INVENTION

Figure 1:
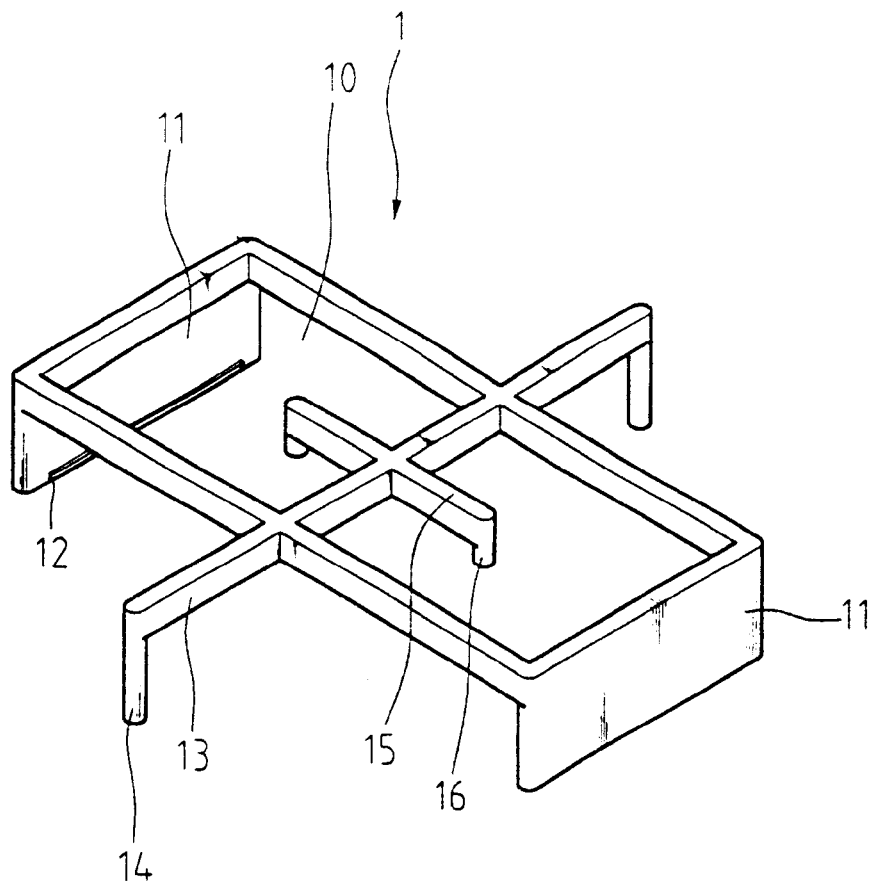
FIG. 1 is a schematic view of an anchor base of this invention in three dimensions.
Figure 2:
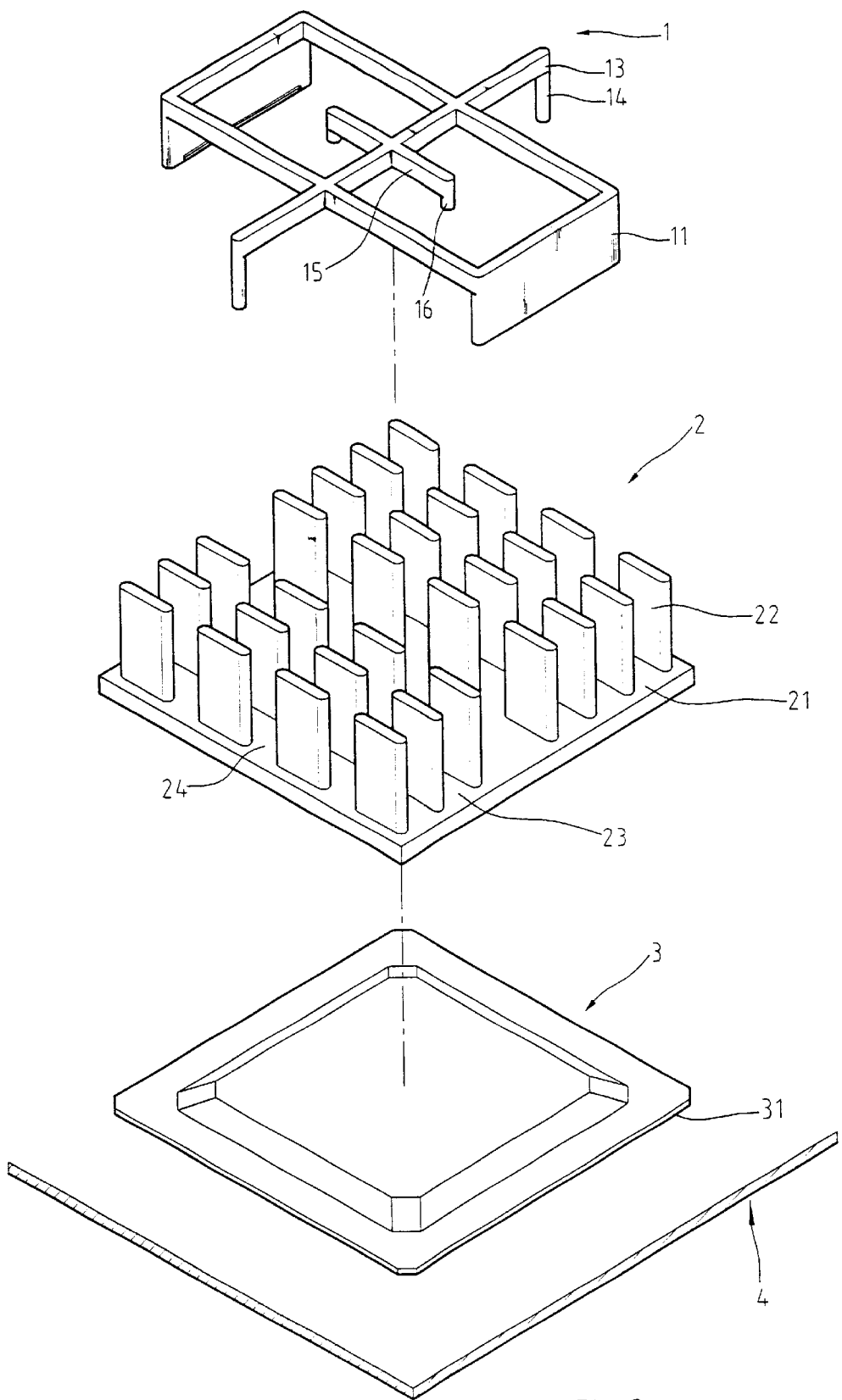
FIG. 2 is an exploded view showing combination of a heat sink, a chipset, and the anchor base of this invention in three dimensions.

According to a preferred embodiment of this invention shown in FIG. 1, an anchor base 1 for a heat sink of an IC chipset in form of a rectangular frame is provided with a rectangular blank 10 in the center. The rectangular frame is extended downwardly from its two opposite lateral stiles to form respective lateral plates 11. A protruding snap barb 12 is formed inwardly on each lateral plate 11 at its lower edge, and a longitudinal resilient rod 13 bridges the other two opposite lateral stiles, wherein both ends of the resilient rod 13 are extended downwardly to form respective protruding rods 14 such that the length in-between the two protruding rods is longer than the distance between the two opposite edges of a heat sink 2 (FIG. 2). The height of the protruding rod 14 is no shorter than that of the lateral plate 11. In the rectangular frame, a relatively shorter resilient rod 15 is arranged perpendicular to the resilient rod 13, and the shorter resilient rod 15 is extended at both ends downwardly to form respective protrusions 16.

Referring to FIG. 2, the heat sink 2 for pairing with the anchor base 1 contains a board 21 having a plurality of fins 22 extended upwardly thereon. The space between two adjacent fins 22 is capable of accommodating: the lateral stiles of the anchor base 1 (excluding the lateral plates 11), the longitudinal resilient rod 13 (excluding the protruding rods 14), and the shorter resilient rod 15, and has a plurality of longitudinal channels 23 and latitudinal channels 24.

Figure 3:
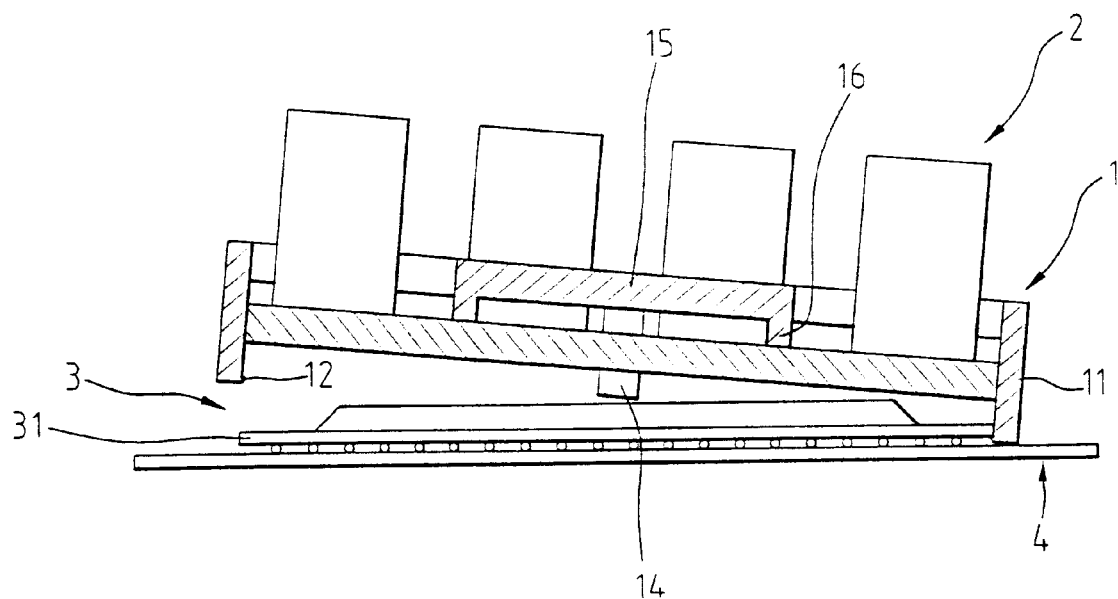
FIG. 3 is a front view of a cutaway section of the combined heat sink, chipset, and anchor base of this invention.
Figure 4:
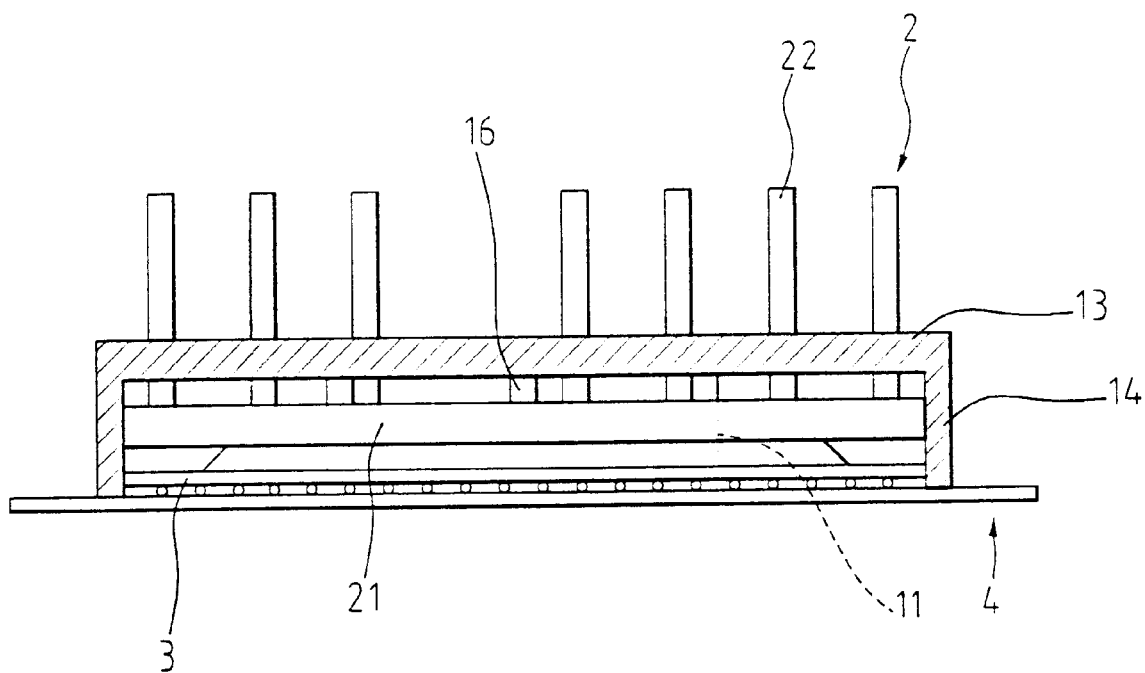
FIG. 4 is a side view of a cutaway section of the combined heat sink, chipset, and anchor base of this invention.

An average chipset 3 soldered on a PCB 4 is provided with a plurality of pins having a height of 0.25 mm above the PCB 4 approximately. When assembling, an operator may hold the heat sink 2 and let its fins 22 pass through the blank 10 of the anchor base 1 from bottom to top, such that the board 21 engages the two lateral stiles other than the stiles of the lateral plates 11 of the anchor base 1 so that those lateral stiles and the shorter resilient rod 15 stay in longitudinal channels 23 while the longitudinal resilient rod 13 stays in a latitudinal channel 24, or vice versa. The operator then depresses the snap barbs 12 of the lateral plates 11 and snaps the same at two corresponding lateral edges 31 of the chipset 3. Thus arranged, the protruding rods 14 bear a torque created by a reaction force from the PCB 4 that results in a bend of the resilient rod 13, which in turn forces the protrusions 16 of the shorter resilient rod 15 closely against the heat sink 2 so as to secure the heat sink 2 together with the chipset 3 rapidly, as indicated in FIGS. 3 and 4. On the other hand, when detachment of the heat sink 2 is desired, all an operator has to do is to pull the anchor base 1 upwardly until the barbs 12 escape from the chipset 3.

According to the abovesaid, the anchor base of this invention is considered advantageous in lowering production cost and has the following merits:

1. In the anchor base 1 for the heat sink 2, there is no need of further perforation or cutting of the heat sink 2 such that heat-dissipation efficiency and manufacturability of the heat sink are both improved.
2. The shorter resilient rod 15 is properly located in the rectangular frame to enlarge the deformation torque of the longitudinal resilient rod 13 and to thereby enhance the pressure applied onto the protrusions 16 by both ends of the shorter resilient rod 15. Thus, the heat sink 2 can be attached closely to the chipset 3 so as to prevent any undesirable gap from being created among the anchor base 1, the heat sink 2, and the chipset 3 so that the heat dissipation rate of the heat sink 2 can be heightened.

In the above described, at least one preferred embodiment has been described in detail with reference to the drawings annexed, and it is apparent that numerous variations or modifications may be made without departing from the true spirit and scope thereof, as set forth in the claims below.

What is claimed is:

1. An anchor base for a heat sink of an IC chipset, the anchor base comprising:

a substantially rectangular frame formed by two opposed pairs of lateral stiles;

two opposite lateral stiles of the frame being provided with respective lateral plates depending therefrom; a snap barb disposed on each lateral plate at its lower inner edge;

at least one longitudinal resilient rod bridging the other two opposite lateral stiles of the rectangular frame; two ends of the longitudinal resilient rod being extended downwardly to form respective protruding rods, wherein the longitudinal resilient rod is longer than a heat sink so as to have the protruding rods located at positions out of the heat sink, and wherein said protruding rods are at least as long as said lateral plates.

2. The anchor base according to claim 1, wherein a relatively shorter resilient rod having its two ends extended downwardly and formed into respective protrusions is intersected approximately perpendicular to the longitudinal resilient rod in the rectangular frame.

3. An anchor base for a heat sink of an IC chipset, the anchor base comprising:

a substantially rectangular frame formed by two opposed pairs of lateral stiles;

two opposite lateral stiles of the frame being provided with respective lateral plates depending therefrom; a snap barb disposed on each lateral plate at its lower inner edge;

at least one longitudinal resilient rod bridging the other two opposite lateral stiles of the rectangular frame; two ends of the longitudinal resilient rod being extended downwardly to form respective protruding rods, wherein the longitudinal resilient rod is longer than a heat sink so as to have the protruding rods located at positions out of the heat sink, and wherein a relatively shorter resilient rod having its two ends extended downwardly and formed into respective protrusions is intersected approximately perpendicular to the longitudinal resilient rod in the rectangular frame.

* * * * *